(12) United States Patent
Cheng et al.

(10) Patent No.: US 10,658,310 B2
(45) Date of Patent: *May 19, 2020

(54) SECURE SEMICONDUCTOR CHIP BY PIEZOELECTRICITY

(71) Applicant: International Business Machines Corporation, Armonk, NY (US)

(72) Inventors: Kangguo Cheng, Schenectady, NY (US); Qing Cao, Yorktown Heights, NY (US); Fei Liu, Yorktown Heights, NY (US); Zhengwen Li, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,323

(22) Filed: Jul. 2, 2019

(65) Prior Publication Data

US 2019/0326229 A1     Oct. 24, 2019

Related U.S. Application Data

(63) Continuation of application No. 15/911,608, filed on Mar. 5, 2018.

(51) Int. Cl.
*H01L 23/00* (2006.01)
*H01L 27/20* (2006.01)
(Continued)

(52) U.S. Cl.
CPC .............. *H01L 23/562* (2013.01); *G01L 1/16* (2013.01); *G06K 19/06* (2013.01); *H01L 27/20* (2013.01);
(Continued)

(58) Field of Classification Search
CPC ......... H01L 41/311; H01L 41/00–0536; H01L 41/08–1138; H01L 27/20
See application file for complete search history.

(56) References Cited

U.S. PATENT DOCUMENTS 3,604,958 A * 9/1971 Palini ........................ G01L 1/16
                                                      310/319
4,378,510 A    3/1983 Bennett
(Continued)

FOREIGN PATENT DOCUMENTS

CN          103097429 B     5/2015

OTHER PUBLICATIONS

IoT Security Foundation Connected Consumer Products Best Practice Guidelines, accessed at https://www.iotsecurityfoundation.org/wp-content/uploads/2016/12/Connected-Consumer-Products.pdf (Year: 2016).*

(Continued)

*Primary Examiner* — Charles D Garber
*Assistant Examiner* — Alia Sabur
(74) *Attorney, Agent, or Firm* — Amin, Turocy & Watson, LLP

(57) ABSTRACT

The subject disclosure relates to techniques for providing semiconductor chip security using piezoelectricity. According to an embodiment, an apparatus is provided that comprises an integrated circuit chip comprising a pass transistor that electrically connects two or more electrical components of the integrated circuit chip. The apparatus further comprises a piezoelectric element electrically connected to a gate electrode of the pass transistor; and a packaging component that is physically connected to the piezoelectric element and applies a mechanical force to the piezoelectric element, wherein the piezoelectric element generates and provides a voltage to the gate electrode as a result of the (Continued)

mechanical force, thereby causing the pass transistor to be in an on-state. In one implementation, the two or more electrical components comprise a circuit and a power source. In another implementation, the two or more electrical components comprise two circuits.

20 Claims, 9 Drawing Sheets

(51) Int. Cl.
*H01L 41/25* (2013.01)
*H01L 41/311* (2013.01)
*G01L 1/16* (2006.01)
*H01L 41/113* (2006.01)
*G06K 19/06* (2006.01)

(52) U.S. Cl.
CPC .......... *H01L 41/1132* (2013.01); *H01L 41/25* (2013.01); *H01L 41/311* (2013.01); *H01L 2223/58* (2013.01)

(56) References Cited

U.S. PATENT DOCUMENTS

| | | | |
|---|---|---|---|
| 6,233,339 B1 | 5/2001 | Kawano et al. | |
| 6,246,970 B1 | 6/2001 | Silverbrook et al. | |
| 8,822,251 B2 | 9/2014 | Yamaguchi et al. | |
| 9,224,848 B2 | 12/2015 | Kikkawa | |
| 9,548,275 B2 | 1/2017 | Ayotte et al. | |
| 2007/0221117 A1 | 9/2007 | Fleischman et al. | |
| 2008/0143519 A1 | 6/2008 | Piotrowski | |
| 2011/0050148 A1 | 3/2011 | Gao et al. | |
| 2013/0141137 A1 | 6/2013 | Krutzik et al. | |
| 2013/0342458 A1 | 12/2013 | Williams et al. | |
| 2014/0191221 A1 | 7/2014 | Benwadih et al. | |
| 2015/0115331 A1 | 4/2015 | Moon et al. | |
| 2015/0161415 A1 | 6/2015 | Kreft | |
| 2017/0289806 A1* | 10/2017 | Girdhar | H04W 4/70 |

OTHER PUBLICATIONS

Eom et al., "Thin-film piezoelectric MEMS", MRS Bulletin, vol. 37, Nov. 2012, pp. 1007-1017.
Non-Final Office Action received for U.S. Appl. No. 15/911,608 dated Dec. 14, 2018, 61 pages.
Putnam et al., "Input/Data Acquisition System Design for Human Computer Interfacing", URL: https://www.cs.princeton.edu/-prc/MUS539/Sensors.pdf, Oct. 17, 1996, pp. 1-29.
Dechev, N., "Lecture 11: Piezoelectric Sensors & Actuators", URL: https://www.engr.uvic.ca/-mech466/, Microelectromechanical Systems, Dept. of Mechanical Engineering, University of Victoria, 2016, 15 pages.
Abu-Faraj, Ziad O., "Handbook of Research on Biomedical Engineering Education and Advanced Bioengineering Learning: Interdisciplinary Concepts", vol. 1, 2012, 56 pages.
List of IBM Patents or Applications Treated as Related.

* cited by examiner

Piezoelectricity principles:

Strain = d33 x E
    wherein d33 is the piezoelectric coefficient; and
    wherein E is the electrical field in piezoelectric material.

E = V / t
    wherein V is the voltage; and
    t is the thickness of the piezoelectric material Therefore, Voltage = strain x t / d33

---

Estimation for the voltage generated by quartz when in a stressed by state applying the piezoelectricity principles above:

d33 is ~ 3E-12 m/V for quartz
    t is ~100nm
    Strain ~1%.

Therefore, Voltage is 1% x 100 nm / 500e-12 m/V = 2V

FIG. 2

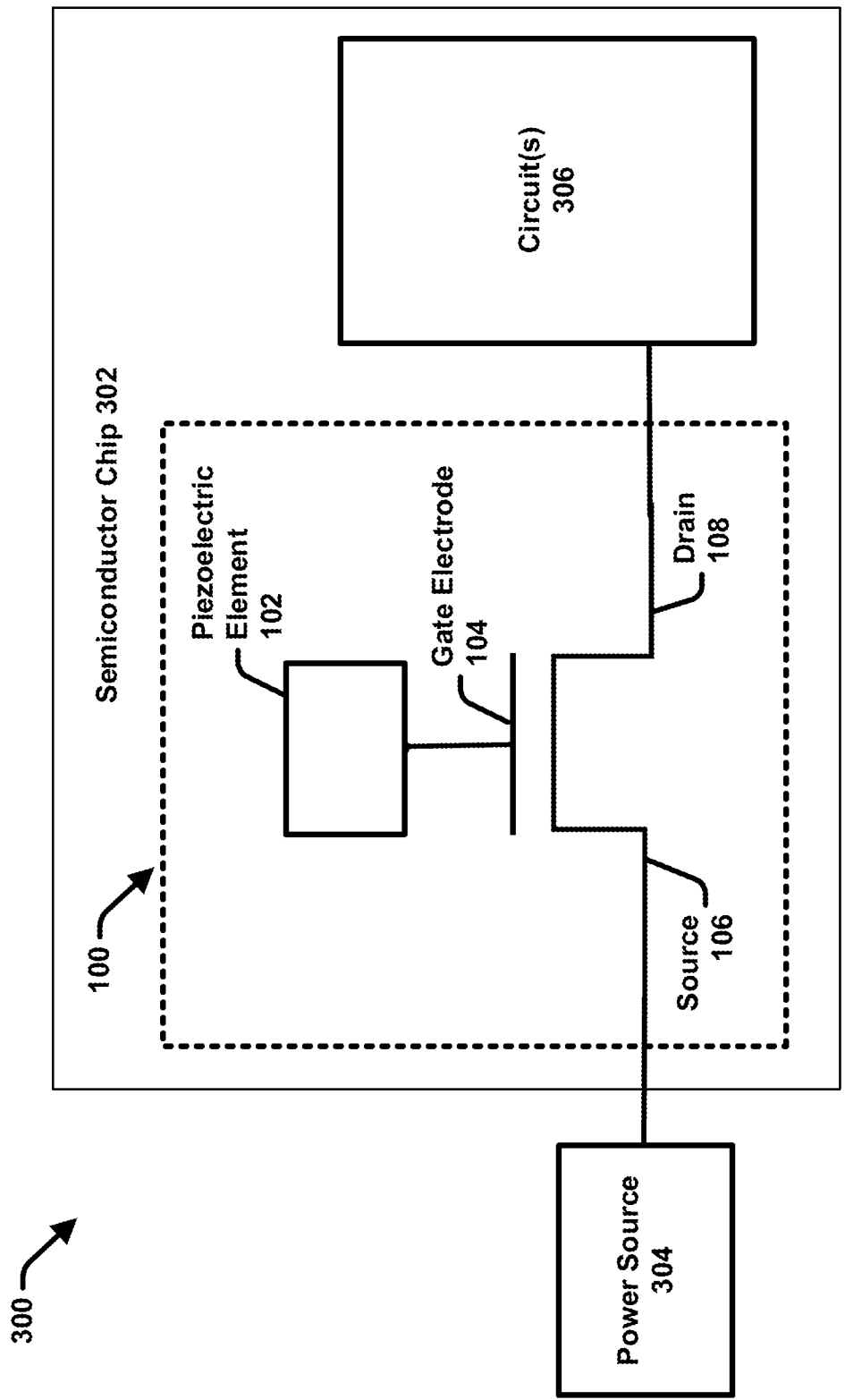

US 10,658,310 B2

SECURE SEMICONDUCTOR CHIP BY PIEZOELECTRICITY

TECHNICAL FIELD

This disclosure relates to techniques for providing semiconductor chip security using piezoelectricity.

SUMMARY

The following presents a summary to provide a basic understanding of one or more embodiments of the invention. This summary is not intended to identify key or critical elements, or delineate any scope of the different embodiments or any scope of the claims. Its sole purpose is to present concepts in a simplified form as a prelude to the more detailed description that is presented later. The subject disclosure relates to techniques for providing semiconductor chip security using piezoelectricity.

According to an embodiment, an apparatus is provided that comprises a power source and a semiconductor chip comprising at least one circuit and a pass transistor that electrically couples the power source and the at least one circuit. The pass transistor comprises a piezoelectric gate comprising a piezoelectric material that produces a voltage that causes the pass transistor to remain in an on-state based on application of a mechanical force to the piezoelectric gate. The piezoelectric material ceases to produce the voltage if the mechanical force is removed, thereby causing the pass transistor to remain in an off-state.

In various implementations, the apparatus can further comprise a packaging component that is physically coupled to the piezoelectric gate and applies the mechanical force to the piezoelectric gate. In this regard, the piezoelectric material ceases to produce the voltage if the mechanical force is removed from the piezoelectric gate, thereby causing the pass transistor to remain in an off-state. According to these implementations, physical separation of the packaging component from the piezoelectric gate can result in removal of the mechanical force. In one implementation, the packaging component can be soldered to the semiconductor chip and the piezoelectric gate is embedded between the semiconductor chip and the packaging component. The piezoelectric material can vary. For example, in some implementations, the piezoelectric material comprises quartz and the voltage generated by the piezoelectric material when under the stress of the mechanical force is about 2.0 Volts (V).

In another embodiment, a semiconductor chip is provided that comprises at least two circuits and a pass transistor that electrically couples the at least two circuits. The pass transistor comprises a piezoelectric gate that produces a voltage that causes the pass transistor to remain in an on-state based on application of a mechanical force to the piezoelectric gate. In this regard, the piezoelectric gate ceases to produce the voltage if the mechanical force is removed from the piezoelectric gate, thereby causing the pass transistor to remain in an off-state. In various implementations, the semiconductor chip further comprises a packaging component that is physically coupled to the piezoelectric gate and applies the mechanical force to the piezoelectric gate. With these implementations, physical separation of the packaging component from the piezoelectric gate results in removal of the mechanical force, thereby removing the voltage generated by the piezoelectric gate and causing the pass transistor to remain in an off-state, and wherein. In some implementations, the packaging component can be soldered to the semiconductor chip and the piezoelectric gate can be embedded between the semiconductor chip and the packaging component.

In yet another embodiment, a method is provided that comprises: forming a semiconductor chip comprising a transistor that electrically connects one or more circuits of the semiconductor chip to a power source, or the electrically connects two or more circuits of the semiconductor chip to one another, wherein the transistor is configured to operate as an electric switch. The method further comprises affixing the semiconductor chip to a packaging substrate comprising a piezoelectric element, wherein based on the affixing, a gate electrode of the transistor is electrically connected to the piezoelectric element and the piezoelectric element generates and applies a voltage to the gate electrode that causes the gate electrode to be in an on-state. In various implementations, the affixing comprises soldering the semiconductor chip to the packaging substrate. The affixing can also comprise wherein the affixing comprising aligning the gate electrode and with the piezoelectric element in association with the soldering. In one or more implementations, the piezoelectric element ceases generation and application of the voltage to the gate electrode, thereby causing the transistor to be in an off-state, based on physical separation of the packaging substrate from the semiconductor chip.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which:

FIG. 2 provides mathematical formulas outlining the principles of piezoelectricity in accordance with embodiments described herein.

FIG. 3 illustrates an example integrated circuit apparatus comprising a pass transistor with a piezoelectric gate in accordance with embodiments described herein.

DETAILED DESCRIPTION

Figure 1:
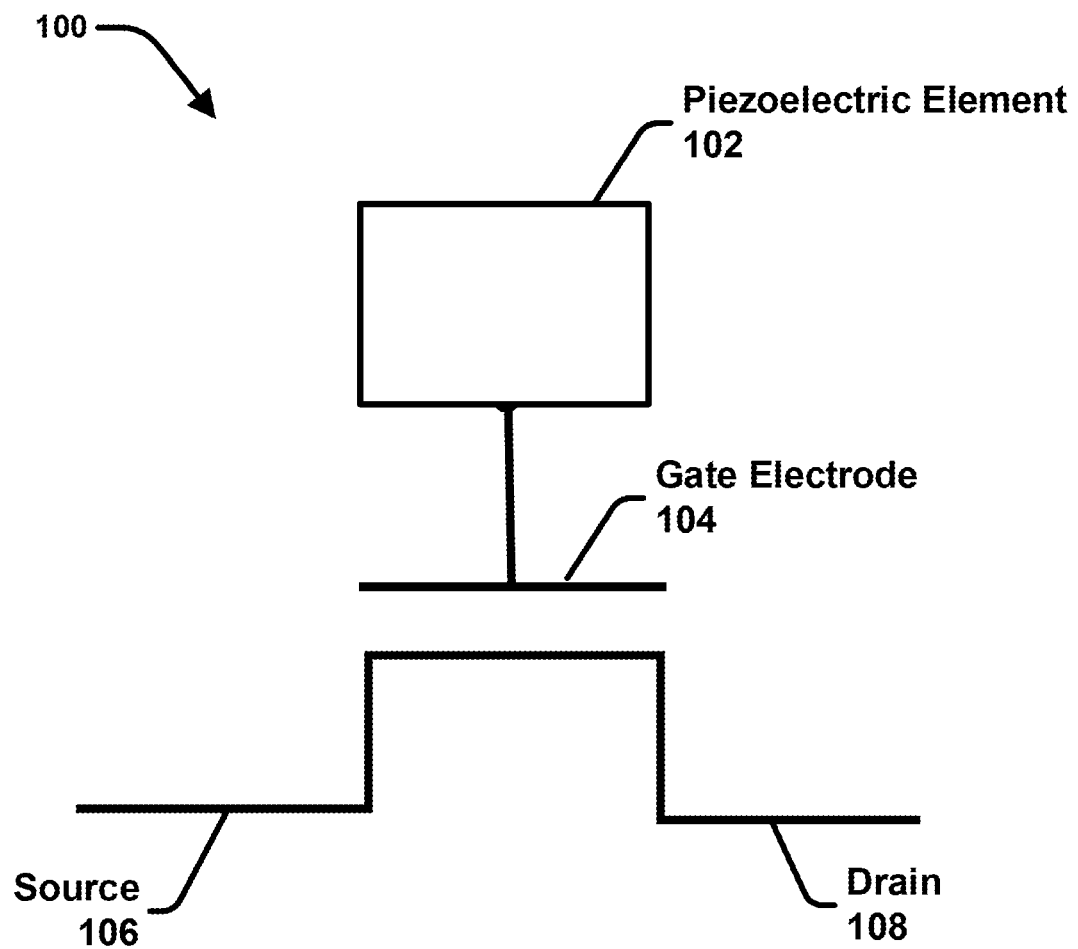
FIG. 1 illustrates an example pass transistor with a piezoelectric gate in accordance with embodiments described herein.

The following detailed description is merely illustrative and is not intended to limit embodiments and/or application or uses of embodiments. Furthermore, there is no intention to be bound by any expressed or implied information presented in the preceding Summary section or in the Detailed Description section.

The subject disclosure relates to semiconductor chip security and more particularly to techniques for using piezoelectricity to hinder unauthorized usage of semiconductor chips. The number Internet of Things (IoT) devices being added to various facets of daily life is increasing at an exponential rate. From the smart home, to healthcare, to connected cars, the IoT is bringing increased connectivity to consumers and enhancing their lives in the process. However, the increased connectivity and complexity of IoT systems presents new risks and threats to safety, security and privacy. As more and more devices become integrated with semiconductor chip based functionality, the possibility of such devices being tampered with by unauthorized individuals with malicious agendas is unfortunately foreseeable. For example, if a device comprising semiconductor chip based functionality falls into the wrong hands, an unauthorized individual may attempt to extract sensitive information stored by the semiconductor chip or attempt to reverse engineer the proprietary functionality of the chip.

The disclosed subject matter is directed to techniques for preventing unauthorized individuals from utilizing a semiconductor chip for any malicious purpose that has been physically tampered with or otherwise removed from its native device. In particular, the disclosed subject matter provides semiconductor chips with a type of built-in self-destruct mechanism that renders the semiconductor chips non-functional if they are physically tampered with or removed from their native devices. This built-in self-destruct mechanism is based on integration of piezoelectric elements with the semiconductor chip.

In particular, when mechanical stress is applied to a piezoelectric material, the piezoelectric material produces an electrical charge or voltage. In accordance with the disclosed subject matter, one or more transistors with piezoelectric gates can be integrated between electrically connected components of a semiconductor chip (e.g., between the power source and one or more circuits of the semiconductor chip and/or between two or more circuits of the semiconductor chip). The piezoelectric gates can consist of a gate electrode and a piezoelectric element that is electrically connected to the gate electrode. The piezoelectric element can comprise a piezoelectric material that generates and provides a voltage to the gate electrode when a mechanical force is applied to the piezoelectric material. The transistor can include any suitable type of transistor that can function as a switch (e.g., that controls turning a device on and off). The disclosed transistors with piezoelectric gates as described herein are thus referred to as pass transistors because they are used to electrically connect two or more circuit elements and control passage of electrical current between the two or more circuit elements. In this regard, when a voltage is applied to the gate electrode of the disclosed pass transistor via the stressed piezoelectric element, the pass transistor will be in an ON state and thus allow current to flow between the electrically connected components of the semiconductor chip. When the voltage is removed (or lowered to less than the threshold voltage) based on removal of the mechanical force to the piezoelectric element, the pass transistor will be in an OFF state and prevent the flow of current between the electrically connected components of the semiconductor chip. As used herein, the term ON state refers to a state of a transistor wherein electrical current flows between the transistor source and the drain, and the term OFF state refers to another state of a transistor wherein electrical current does not flow between the source and the drain. A transistor can be in either an ON state or an OFF state.

In one or more embodiments, the piezoelectric element of the pass transistor can be strained during packaging or integration of the semiconductor chip onto a package substrate. For example, in some implementations, the semiconductor chip can be soldered to or otherwise physically attached to a packaging substrate (or another packaging component) such that the piezoelectric element is embedded between the semiconductor chip and the package substrate. The manner in which the semiconductor chip and package substrate are physically attached can result in placing the piezoelectric element in a state of constant strain unless the substrate and the semiconductor chip are tampered with or otherwise detached from one another. In this regard, the piezoelectric element, which is electrically connected to the gate electrode of the pass transistor provided between two electrically connected components of the semiconductor chip (e.g., one or more circuits and the power source and/or two or more circuits), will remain in the ON state under normal operation based on the voltage supplied by the stressed piezoelectric element. However, if a malicious entity separates the semiconductor chip from the package substrate, the piezoelectric element will no longer be stressed and thus no longer supply the voltage needed to keep the pass transistor ON, thereby electrically decoupling the integrated circuit components. As a result, if the malicious entity attempts to connect the removed semiconductor chip to a new power source, the semiconductor chip will be non-functional.

For example, if the pass transistor is formed between the circuit line that connects the power source to the one or more circuits of the semiconductor chip, the pass transistor will prevent any electrical current from reaching the one or more circuits due to it being in an OFF state without the voltage supplied by the piezoelectric element. In some embodiments, in order to prevent the malicious individual from bypassing this type of master switch and providing power directly to the integrated circuit elements, additional pass transistors can be placed between different circuit elements. With these embodiments, the likelihood of the malicious individual being able to reverse engineer the semiconductor chip and discover why the semiconductor chip is dysfunctional (e.g., due to the disconnection between the different circuit elements) becomes increasingly difficult.

One or more embodiments are now described with reference to the drawings, wherein like referenced numerals are used to refer to like elements throughout. It should be appreciated that the various structures depicted in the drawings (e.g., the semiconductor ships, the piezoelectric elements, the solder balls, the packaging components, etc.) are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements. As used herein, terms such as upper, lower, above, below, directly above, directly below, aligned with, adjacent to, right, left, vertical, horizontal, top, bottom, and derivatives thereof shall relate to the disclosed structures as oriented in the drawing figures.

Turning now to the drawings, FIG. 1 illustrates an example pass transistor 100 with a piezoelectric gate in accordance with embodiments described herein. The pass transistor 100 can include various types of transistors (e.g., a field effect transistor) capable of functioning as an electrical switch that switches to an ON state and allows passage of electrical current therethrough when a threshold voltage (or greater) is applied to the gate electrode, and that switches to an OFF state and prevents passage of electrical current therethrough when the voltage applied to the gate electrode drops to less than the threshold voltage. In this regard, the pass transistor 100 can comprise at least a source 106, a drain 108 and a gate electrode 104. The pass transistor 100 can further comprise a piezoelectric element 102 that is electrically connected to the gate electrode 104 (e.g., directly or via a conduction line). In one or more embodiments, the combination of the gate electrode 104 and the electrically connected piezoelectric element 102 is referred to herein as the piezoelectric gate.

The piezoelectric element 102 can comprise a piezoelectric material that generates and provides a sufficient voltage to the gate electrode 104 to cause the gate electrode to be in an ON state when the piezoelectric element 102 is mechanically strained or stressed. When the mechanical stress is released, the piezoelectric element 102 becomes relaxed, and fails to generate a voltage (or a sufficient voltage) to keep the transistor in the ON state. Accordingly, the piezoelectric element 102 can be configured to control the ON state and OFF state of the pass transistor 100 based on application and removal of a mechanical force to the piezoelectric element 102. In one or more embodiments, the piezoelectric element 102 can be formed with quartz. Other suitable piezoelectric materials that can be employed for the piezoelectric element include but are not limited to, one or more of: aluminum nitride, apatite, barium titanate, bismuth titanate, gallium phosphate, lanthanum gallium silicate, lead scandium tantalite, lead zirconate titanate (PZT), lithium tantalite, potassium sodium tartrate, quartz, sodium bismuth titanate, etc. In some embodiments, the piezoelectric material can also include one or materials in the potassium niobate family (e.g., $KNbO_3$), and/or one or more materials in the bismuth titanate family (e.g., $Bi_4Ti_3O_{12}$, $SrTi_4Bi_4O_{15}$, and $(Na_{0.5}Bi_{0.5})$ TiO3). Structurally the piezoelectric element 102 can physically be abutting the gate electrode 104.

For example, FIG. 2 provides mathematical formulas outlining the principles of piezoelectricity in accordance with embodiments described herein. Piezoelectricity is the electric charge that accumulates in certain solid materials in response to applied mechanical stress. The piezoelectric effect is understood as the linear electromechanical interaction between the mechanical and the electrical state in crystalline materials with no inversion symmetry. The piezoelectric effect is a reversible process in that materials exhibiting the direct piezoelectric effect (the internal generation of electrical charge resulting from an applied mechanical force) also exhibit the reverse piezoelectric effect (the internal generation of a mechanical strain resulting from an applied electrical field).

As presented in FIG. 2, the amount of strain applied to a piezoelectric material impacts the electrical field (E) generated by the piezoelectric material as a function of the material's piezoelectric coefficient (d33). The piezoelectric coefficient (d33) quantifies the volume change when a piezoelectric material is subject to an electric field, or the polarization on application of a stress. The value of the piezoelectric coefficient varies based on the piezoelectric material (e.g., each type of piezoelectric material has a specific piezoelectric coefficient). The electrical field (E) is a function of the amount of voltage generated (V) by the piezoelectric material divided by the thickness (t) of the piezoelectric material. Therefore, the amount of voltage (V) generated by a piezoelectric material when stressed or strained can be calculated as a function of the amount of strain applied multiplied the thickness of the material divided by the piezoelectric coefficient (d33). When these principles are applied to piece of quartz having a thickness of about 100 nanometers (nm) under a 1% amount of strain, the amount of voltage capable of being generated is about 2.0 volts.

With reference again to FIG. 1, in one or more embodiments, the gate electrode 104 can include a suitable conducting material such as but not limited to: doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material of the gate electrode 104 can also comprise dopants that are incorporated during or after deposition.

In some embodiments, the piezoelectric gate can comprise a work-function setting layer (not shown) between a gate dielectric layer (not shown) and the gate electrode 104. The work-function setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate electrode 104 and WFM. The gate electrode 104 and the WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In some implementations, the gate electrode 104 can be formed on a semiconductor substrate (e.g., silicon wafer) with a gate dielectric layer (not shown) between the gate electrode 104 and the silicon substrate. The gate dielectric can comprise any suitable dielectric (or high-k) material, including but not limited to silicon oxide, silicon nitride, silicon oxynitride, high-k materials, or any combination of these materials. Some example high-k materials that can be used as the dielectric layer include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum, aluminum, magnesium. The gate dielectric layer can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric layer has a thickness ranging from 1.0 nm to 5.0 nm, although less thickness and greater thickness are also conceived.

The source/drain can be formed in a semiconductor substrate with dopants, for instance, doped with n-type or p-type atoms at a concentration between $5 \times 10^{18}$ cm$^{-3}$ and $3 \times 10^{21}$ cm$^{-3}$. In one or more embodiments, the material and thickness of the piezoelectric element 102, (and the corresponding amount of voltage capable of being generated by the piezoelectric element when stressed), can be tailored based on the threshold voltage of the pass transistor 100, and vice versa. For example, in implementations in which the piezoelectric element comprises quartz having a thickness of about 100 nm, the pass transistor 100 can have a threshold voltage of 2.0 volts.

FIG. 3 illustrates an example integrated circuit apparatus 300 comprising a pass transistor 100 with a piezoelectric gate in accordance with embodiments described herein. Repetitive description of like elements employed in respective embodiments is omitted for sake of brevity.

In the embodiment shown, the integrated circuit apparatus 300 comprises a power source 304 and a semiconductor chip 302. The semiconductor chip 302 comprises a pass transistor 100 with a piezoelectric gate (wherein the piezoelectric gate comprises the gate electrode 104 and the piezoelectric element 102), and one or more electrical circuits 306. The pass transistor 100 is formed between the power source 304 and the one or more electrical circuits 306 and electrically connects the one or more electrical circuits 306 to the power source 304. In some implementations, the power source 304 and the semiconductor chip 302 can be formed on a shared printed circuit board (PCB), (not shown). With these embodiments, the power source 304 can be electrically connected to the pass transistor 100 via one or more suitable conduction components (e.g., metal lines, wires, etc.). Other physical arrangements are envisioned.

With this embodiment, the pass transistor 100 can be configured to function as a master switch that controls provision of electrical current from the power source 304 to the one or more electrical circuits 306. In particular, the pass transistor 100 can be configured to allow current to pass from the power source 304 to the one or more electrical circuits 306 when a threshold voltage (or greater) is generated and applied to the gate electrode 104 by the piezoelectric element 102 based on application of a mechanical force to the piezoelectric element 102. As described infra with reference to FIGS. 6 and 7, in various embodiments, this mechanical force can be a constant force that is applied to the piezoelectric element 102 by a packaging component (e.g., a package substrate 606 or another type of structural component) formed on or around the semiconductor chip 302 in a manner that causes the piezoelectric element 102 to remain in a stressed state unless the packaging component is physically separated from the semiconductor chip 302. Therefore, when in a mechanically stressed state under normal operation of the integrated circuit apparatus, the piezoelectric element 102 produces a voltage to keep the pass gate on (e.g., in an ON state) so that the power source 304 can reach the one or more electrical circuits 306 to keep them functional. If the mechanical stress applied to the piezoelectric element 102 is removed (e.g., based on removal or an attempt to remove, the semiconductor chip 302 from the package component), the pass transistor 100 will switch off and the one or electrical circuits 306 will not function.

Figure 4:
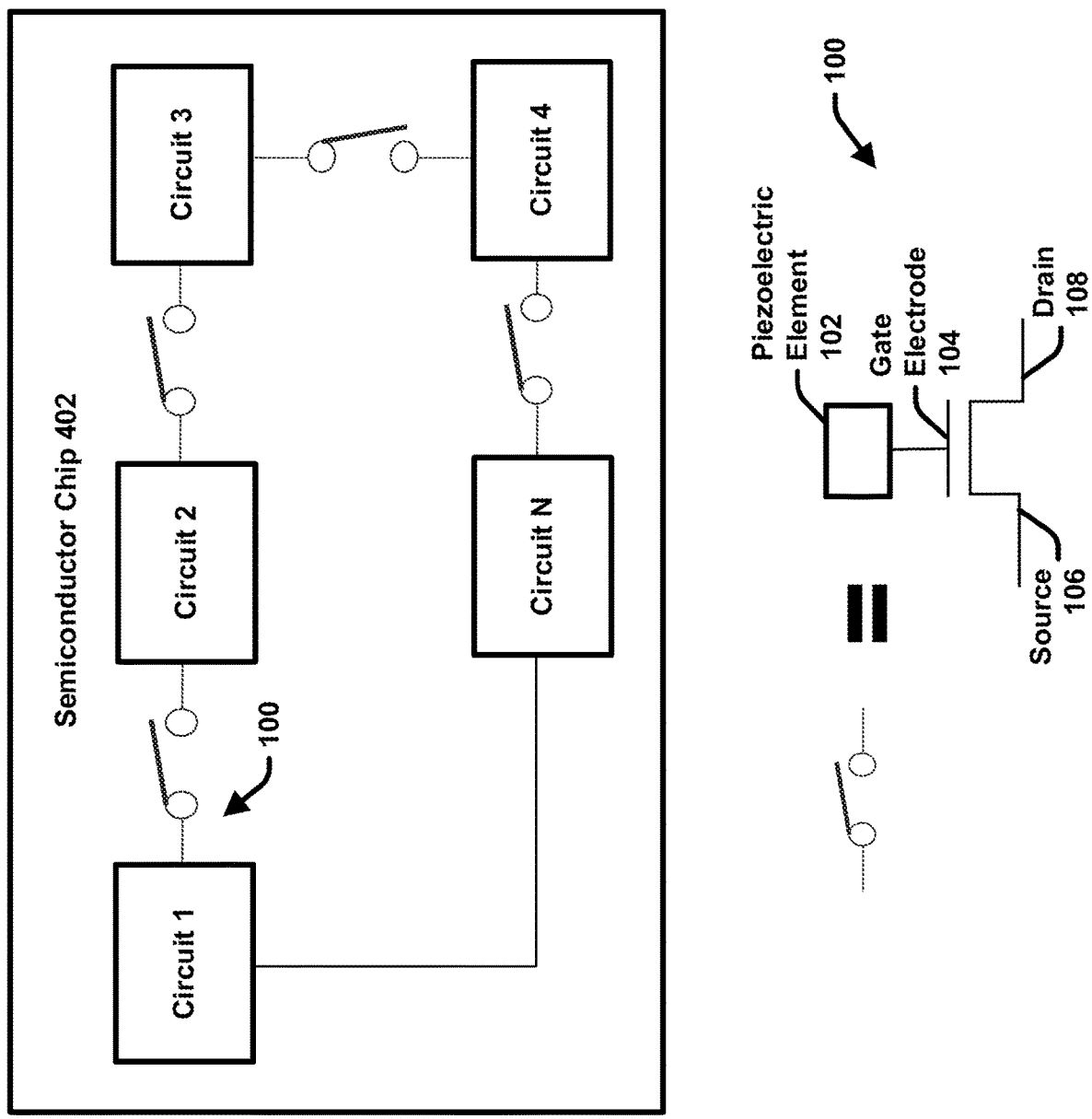
FIG. 4 illustrates an example semiconductor chip comprising a plurality of pass transistors with piezoelectric gates in accordance with embodiments described herein.

FIG. 4 illustrates an example semiconductor chip 402 comprising a plurality of pass transistors 100 with piezoelectric gates in accordance with embodiments described herein. Repetitive description of like elements employed in respective embodiments is omitted for sake of brevity.

In the embodiment shown, the semiconductor chip 402 comprises a plurality of different circuits (respectively identified as circuits 1-N) that are respectively electrically connected by pass transistors 100. It should be appreciated that the number of circuits included on the semiconductor chip 402 can vary. The number of circuits that are electrically coupled by a pass transistor 100 can also vary. For example, in one implementation, the semiconductor chip 402 can comprise a plurality of different circuits and include pass gates formed between a subset of the circuits. In this regard, some circuits of the semiconductor chip 402 can be electrically connected by a pass transistor 100 while others are not electrically connected by a pass gate. In some embodiments, the pass transistors 100 can be randomly incorporated into the semiconductor chip in a fashion that makes it extremely difficult for a malicious entity to reverse engineer the semiconductor chip 402 to find each of the pass transistors 100.

With this embodiment, the pass transistors 100 can be configured to function as intermediary switches that control the flow of electrical current between different circuits of the semiconductor chip 402. In particular, each of the pass transistors 100 can be configured to allow current to pass between the respective circuits the pass transistors 100 connect when a threshold voltage (or greater) is generated and applied to the gate electrodes 104 by the piezoelectric elements 102 based on application of a mechanical force to the piezoelectric elements 102. As described infra with reference to FIGS. 6 and 7, in various embodiments, this mechanical force can be a constant force that is applied to the piezoelectric elements 102 by a packaging component (e.g., a package substrate 606 or another type of structural component) formed on or around the semiconductor chip 402 in a manner that causes the piezoelectric elements 102 to remain in a stressed state unless the packaging component is physically separated from the semiconductor chip 402. Therefore, when in a mechanically stressed state under normal operation of the semiconductor chip 402, the piezoelectric elements 102 produce a voltage to keep the pass gate on (e.g., in an ON state) so that electrical current can flow between the circuits to keep them functional. If the mechanical stress applied to the piezoelectric elements 102 is removed (e.g., based on removal or an attempt to remove, the semiconductor chip 402 from the package component), the pass transistors 100 will switch off and the semiconductor chip 402 will be unfunctional.

Figure 5:
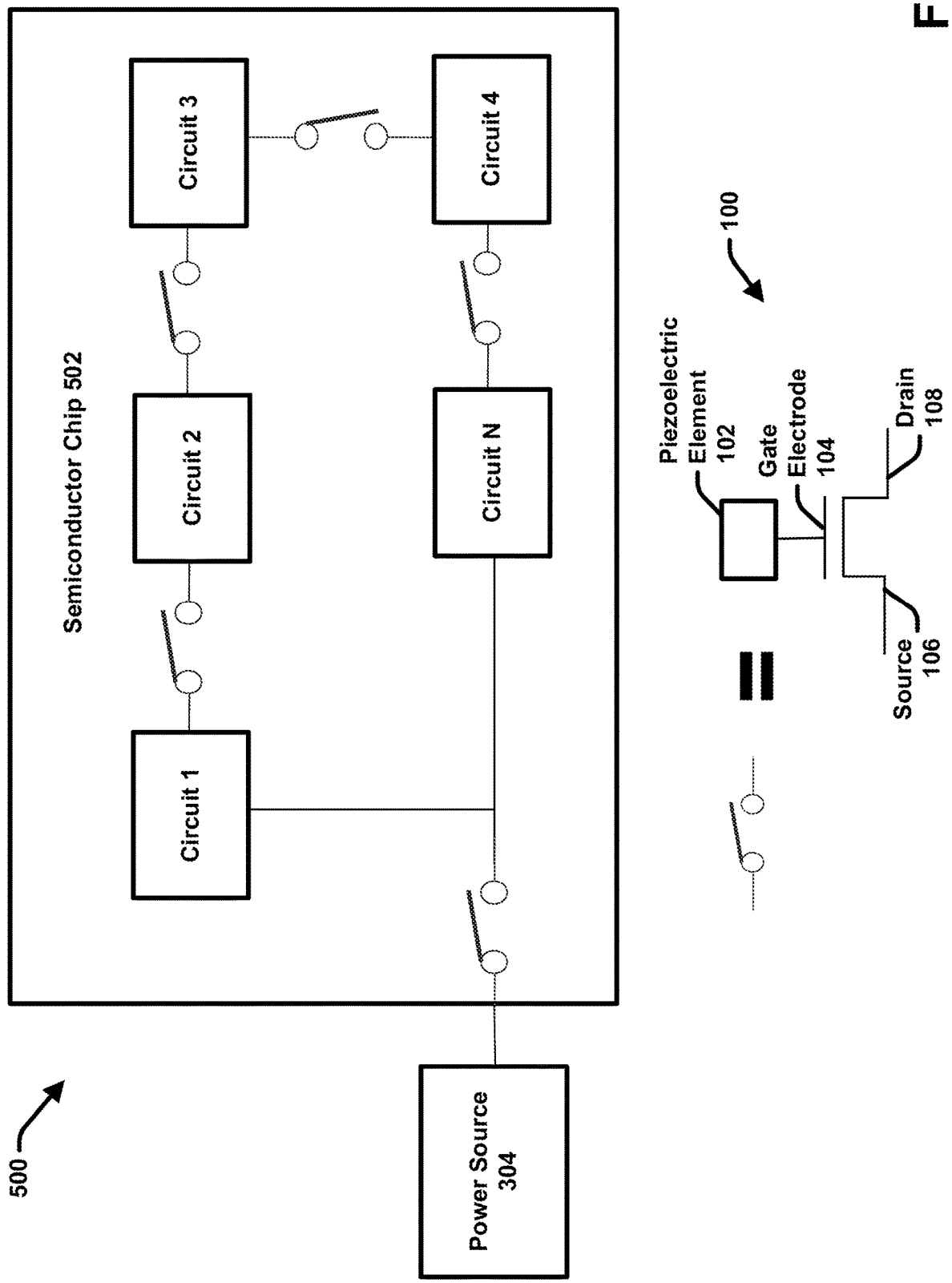
FIG. 5 illustrates another example integrated circuit apparatus comprising a plurality of pass transistors with piezoelectric gates in accordance with embodiments described herein.

FIG. 5 illustrates another example integrated circuit apparatus 500 comprising a plurality of pass transistors with piezoelectric gates in accordance with embodiments described herein. The integrated circuit apparatus 500 combines the features and functionalities of integrated circuit apparatus 300 and the semiconductor chip 402. In this regard, the integrated circuit apparatus 500 can comprise a semiconductor chip 502 that includes a plurality of circuits, wherein two or more of the circuits are electrically connected by a pass transistor 100. These integrated circuits can provide the intermediary switch functionality discussed with reference to semiconductor chip 402. The integrated circuit apparatus 500 can further include a power source 304 and a pass transistor 100 that electrically couples each of the circuits of the semiconductor chip 502 to the power source 304. As described with reference to integrated circuit apparatus 300, this additional pass gate can function as a master switch to control the functionality of the entire semiconductor chip 502 based on whether this pass gate is switched on or off in accordance with the mechanisms disclosed herein. Repetitive description of like elements employed in respective embodiments is omitted for sake of brevity.

Figure 6:
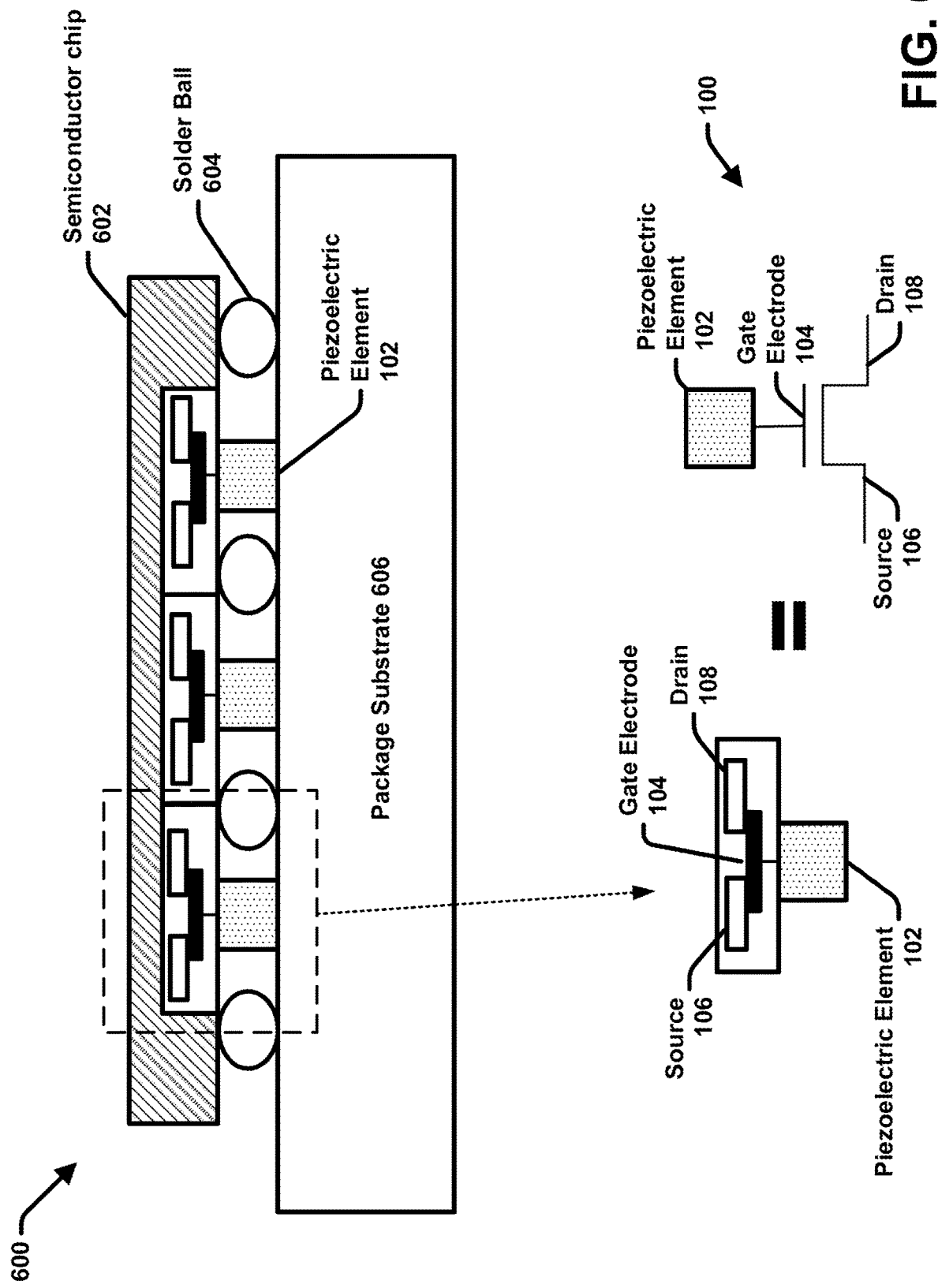
FIG. 6 illustrates an example apparatus comprising a semiconductor chip with one or more pass gates in accordance with embodiments described herein FIGS. 7A and 7B demonstrate the disclosed piezoelectricity based semiconductor chip security mechanism in accordance with embodiments described herein.

FIG. 6 illustrates an example apparatus 600 comprising a semiconductor chip 602 with one or more pass transistors 100 in accordance with embodiments described herein. The semiconductor chip 602 can be or correspond to semiconductor chip 302, semiconductor chip 402, semiconductor chip 502, and the like. In this regard, it should be appreciated that apparatus 600 is demonstrated with three pass gates merely for exemplary purposes, and that the apparatus 600 can comprise any number of pass gates greater than or equal to one. Repetitive description of like elements employed in respective embodiments is omitted for sake of brevity.

In the embodiment shown, the semiconductor chip 602 is affixed to a package substrate 606 via one or more solder balls 604 such that the piezoelectric elements 102 of the pass transistors 100 are embedded or sandwiched between the package substrate 606 and the semiconductor chip 602. The piezoelectric elements 102 are depicted with a speckled or dotted fill to indicate that the piezoelectric elements 102 are in a stressed state and thus generating and applying a voltage to the gate electrodes 104. In this regard, the manner in which the semiconductor chip 602 is affixed to the package substrate via the solder balls 604 can result in the application of a constant force or pressure to the piezoelectric elements 102. As a result, in the embodiment shown, the pass transistors 100 are switched to an ON state based on the physical attachment between the semiconductor chip 602 and the package substrate 606. The pass transistors 100 are thus configured to remain in the ON state unless the force or pressure is removed from the piezoelectric elements based on detachment of the semiconductor chip 602 from the package substrate 606.

The material of the package substrate 606 can vary. For example, the package substrate 606 can comprise a plastic, polymer, ceramic, glass, or another suitable material. It should be appreciated that the manner in which a constant pressure can be applied to the piezoelectric elements 102 by a structural component of a native apparatus that houses the semiconductor chip 602 can vary. In this regard, other structural components (alternative to the package substrate 606), other attachment mechanisms (alternative to soldering), and structural arrangements are envisioned.

Figure 7A:
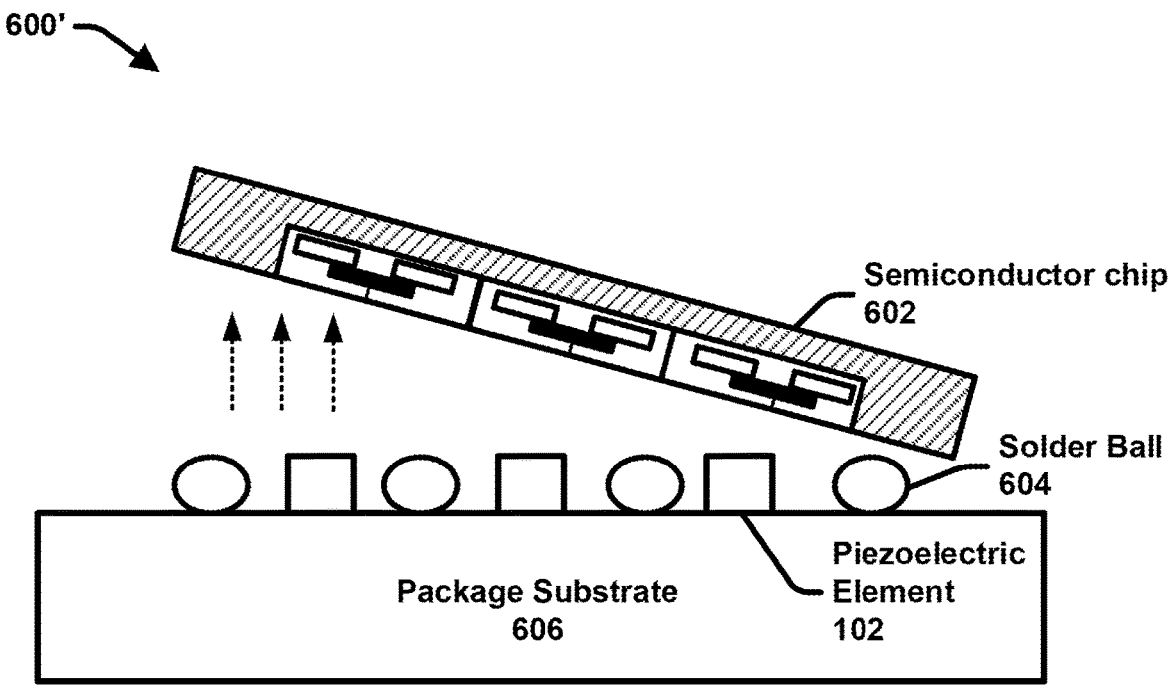
Figure 7B:
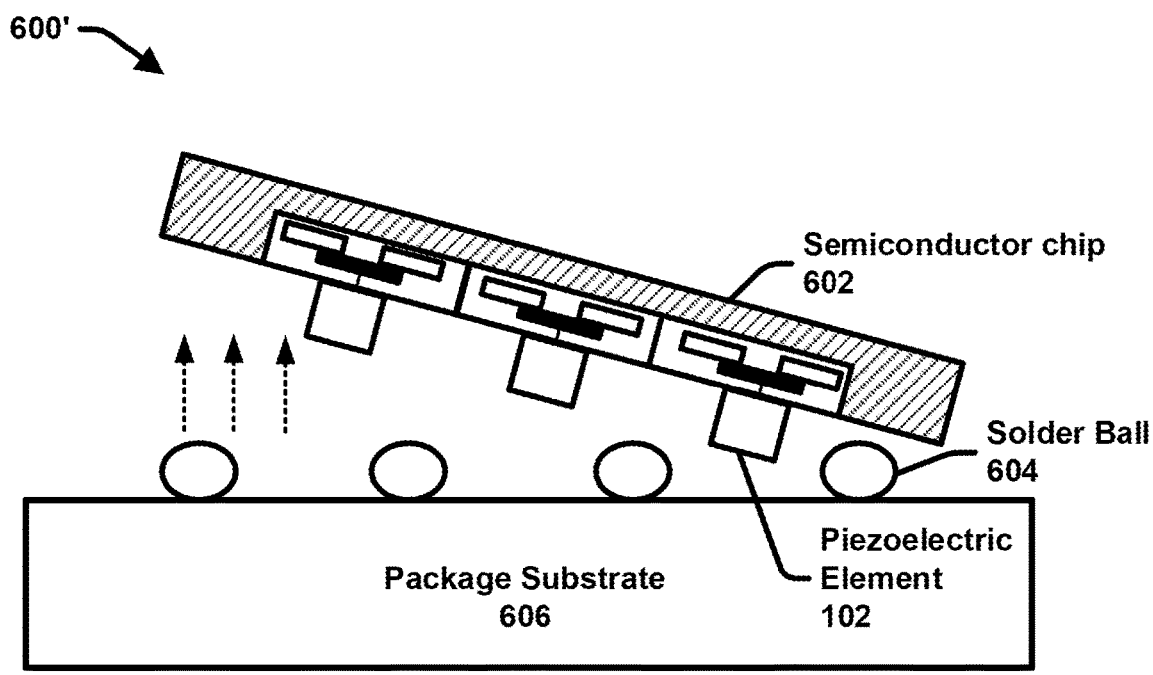

FIGS. 7A and 7B demonstrate the disclosed piezoelectricity based semiconductor chip security mechanism in accordance with embodiments described herein. Repetitive description of like elements employed in respective embodiments is omitted for sake of brevity.

In FIGS. 7A and 7B, depict a deconstructed version 600' of the apparatus 600 shown in FIG. 6. In particular, as shown in FIGS. 7A and 7B, the semiconductor chip 602 of apparatus 600 has been detached from the package substrate 606. As a result, the piezoelectric elements 102 are depicted with a solid grey fill (e.g., without the speckled or dotted fill) to indicate that the piezoelectric elements 102 are in a relaxed state as a result of removal of the mechanical force imparted by the semiconductor chip 602 and/or the package substrate 606 when the semiconductor chip 602 was affixed to the package substrate 606. Therefore, the piezoelectric elements 102 no longer provide the voltage needed to keep the pass transistors 100 in the ON state. As a result, if the semiconductor chip 602 was connected to a new power source, the semiconductor chip 602 would be non-functional due to the decoupled electrical connections between the semiconductor circuit components that are connected via the pass transistors which are now in an OFF state. In one embodiment, as shown in FIG. 7A, the piezoelectric elements 102 can be configured to remain attached to the package substrate 606 if the semiconductor chip 602 is separated from the package substrate 606. According to this embodiment, the piezoelectric elements 102 can be affixed to the package substrate 606 during fabrication of the apparatus 600. In another embodiment, as shown in FIG. 7B, the piezoelectric elements 102 can be configured to remain attached to the semiconductor chip 602 when the semiconductor chip 602 is detached from the package substrate 606. According to this embodiment, the piezoelectric elements 102 can be affixed to the semiconductor chip 602 during fabrication of the apparatus 600.

Figure 8:
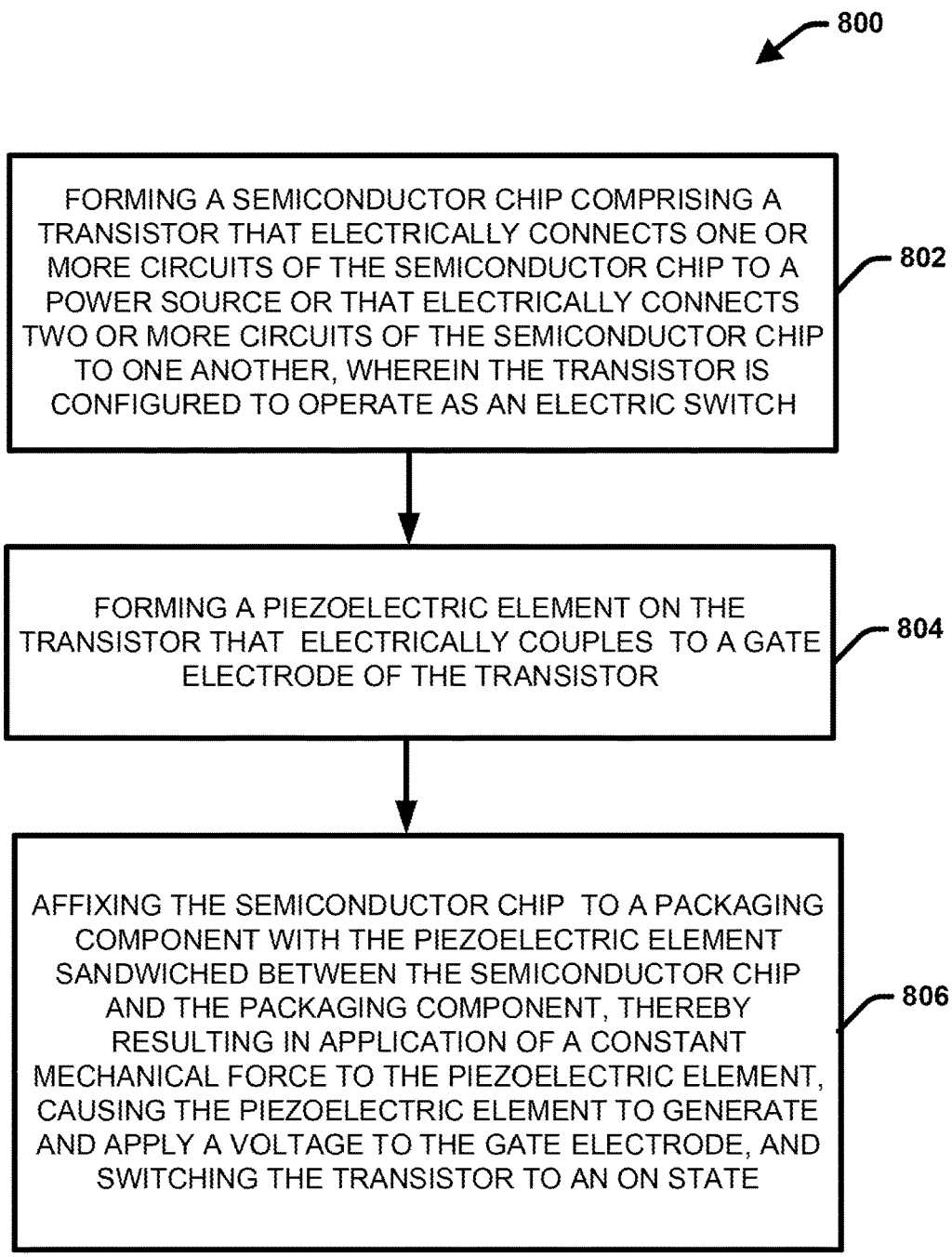
FIG. 8 illustrates a flow diagram of an example, non-limiting method for generating a secure semiconductor chip apparatus in accordance with one or more embodiments described herein.
Figure 9:
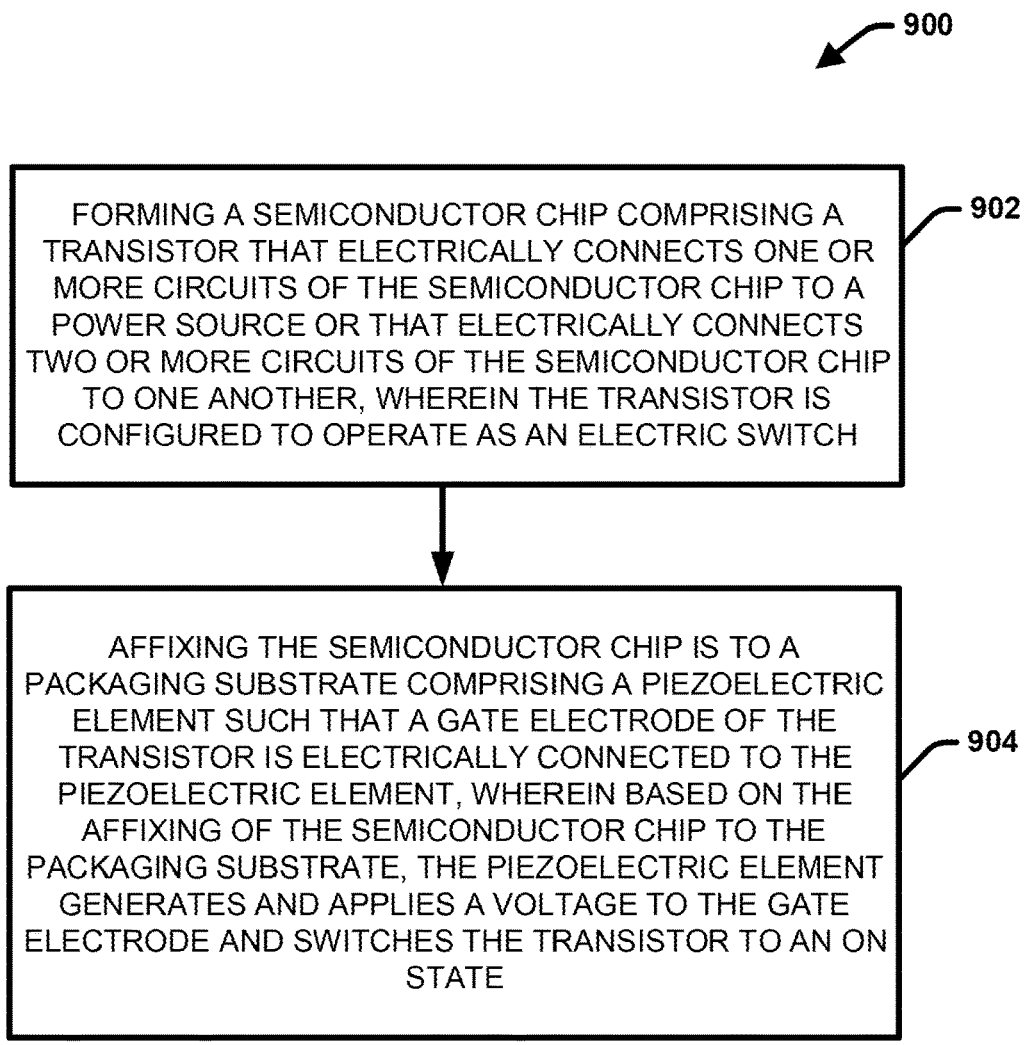
FIG. 9 illustrates a flow diagram of another example, non-limiting method for generating a secure semiconductor chip apparatus in accordance with one or more embodiments described herein.

In view of the example apparatus, semiconductor chips, and security enhancement techniques described herein, example methods that can be implemented in accordance with the disclosed subject matter can be further appreciated with reference to the flowcharts in FIGS. 8 and 9. It is to be understood and appreciated that the subject innovation is not limited by the acts illustrated and/or by the order of acts, for example acts can occur in various orders and/or concurrently, and with other acts not presented and described herein. Repetitive description of like elements employed in respective embodiments is omitted for sake of brevity.

FIG. 8 illustrates a flow diagram 800 of an example, non-limiting method for generating a secure semiconductor chip apparatus (e.g., apparatus 600) in accordance with one or more embodiments described herein. Repetitive description of like elements employed in respective embodiments is omitted for sake of brevity.

At 802, a semiconductor chip is formed comprising a transistor that electrically connects one or more circuits of the semiconductor chip to a power source or that electrically connects two or more circuits of the semiconductor chip to one another, wherein the transistor is configured to operate as an electric switch. At 804, a piezoelectric element is formed on the transistor and electrically coupled to a gate electrode of the transistor. At 806, the semiconductor chip is affixed to a packaging component with the piezoelectric element sandwiched between the semiconductor chip and the packaging component, thereby resulting in application of a constant mechanical force to the piezoelectric element, causing the piezoelectric element to generate and apply a voltage to the gate electrode, and switching the transistor to an ON state.

FIG. 9 illustrates a flow diagram 900 of another example, non-limiting method for generating a secure semiconductor chip apparatus (e.g., apparatus 600) in accordance with one or more embodiments described herein. Repetitive description of like elements employed in respective embodiments is omitted for sake of brevity.

At 902, a semiconductor chip is formed comprising a transistor that electrically connects one or more circuits of the semiconductor chip to a power source or that electrically connects two or more circuits of the semiconductor chip to one another, wherein the transistor is configured to operate as an electric switch. At 904 the semiconductor chip is affixed to a packaging substrate comprising a piezoelectric element such that a gate electrode of the transistor is electrically connected to the piezoelectric element, wherein based on the affixing of the semiconductor chip to the packaging substrate, the piezoelectric element generates and applies a voltage to the gate electrode and switches the transistor to an ON state.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A device, comprising:
    a power source; and
    a semiconductor chip comprising at least one circuit and a pass transistor that electrically couples the power source and the at least one circuit, wherein the pass transistor comprises a piezoelectric gate comprising a piezoelectric material that produces a voltage that causes the pass transistor to remain in an on-state based on application of a mechanical force to the piezoelectric gate,
    wherein the device is an Internet of Things device.

2. The device of claim 1, wherein the piezoelectric material ceases to produce the voltage if the mechanical force is removed, thereby causing the pass transistor to remain in an off-state.

3. The device of claim 1, further comprising:
    a packaging component that is physically coupled to the piezoelectric gate and applies the mechanical force to the piezoelectric gate.

4. The device of claim 3, wherein the piezoelectric material ceases to produce the voltage if the mechanical force is removed from the piezoelectric gate, thereby causing the pass transistor to remain in an off-state, and wherein physical separation of the packaging component from the piezoelectric gate results in removal of the mechanical force.

5. The device of claim 3, wherein the packaging component is soldered to the semiconductor chip, and wherein the piezoelectric gate is embedded between the semiconductor chip and the packaging component.

6. The device of claim 1, wherein the piezoelectric material comprises quartz and wherein the voltage is about 2.0 Volts (V).

7. The device of claim 1, wherein the piezoelectric material has a thickness of about 100 nanometers (nm).

8. A device, comprising:
    a power source; and
    a semiconductor chip comprising at least one circuit and a pass transistor that electrically couples the power source and the at least one circuit, wherein the pass transistor comprises a piezoelectric gate comprising a piezoelectric material that produces a voltage that causes the pass transistor to remain in an on-state based on application of a mechanical force to the piezoelectric gate, wherein the device is a healthcare device.

9. The device of claim 8, wherein the piezoelectric material ceases to produce the voltage if the mechanical force is removed, thereby causing the pass transistor to remain in an off-state.

10. The device of claim 8, further comprising:
a packaging component that is physically coupled to the piezoelectric gate and applies the mechanical force to the piezoelectric gate.

11. The device of claim 10, wherein the piezoelectric material ceases to produce the voltage if the mechanical force is removed from the piezoelectric gate, thereby causing the pass transistor to remain in an off-state, and wherein physical separation of the packaging component from the piezoelectric gate results in removal of the mechanical force.

12. The device of claim 10, wherein the packaging component is soldered to the semiconductor chip, and wherein the piezoelectric gate is embedded between the semiconductor chip and the packaging component.

13. The device of claim 8, wherein the piezoelectric material comprises quartz and wherein the voltage is about 2.0 Volts (V).

14. The device of claim 8, wherein the piezoelectric material has a thickness of about 100 nanometers (nm).

15. A device, comprising:
a power source; and
a semiconductor chip comprising at least one circuit and a pass transistor that electrically couples the power source and the at least one circuit, wherein the pass transistor comprises a piezoelectric gate comprising a piezoelectric material that produces a voltage that causes the pass transistor to remain in an on-state based on application of a mechanical force to the piezoelectric gate, wherein the device is a smart home device.

16. The device of claim 15, wherein the piezoelectric material ceases to produce the voltage if the mechanical force is removed, thereby causing the pass transistor to remain in an off-state.

17. The device of claim 15, further comprising:
a packaging component that is physically coupled to the piezoelectric gate and applies the mechanical force to the piezoelectric gate.

18. The device of claim 17, wherein the piezoelectric material ceases to produce the voltage if the mechanical force is removed from the piezoelectric gate, thereby causing the pass transistor to remain in an off-state, and wherein physical separation of the packaging component from the piezoelectric gate results in removal of the mechanical force.

19. The device of claim 17, wherein the packaging component is soldered to the semiconductor chip, and wherein the piezoelectric gate is embedded between the semiconductor chip and the packaging component.

20. The device of claim 15, wherein the piezoelectric material comprises quartz and wherein the voltage is about 2.0 Volts (V).

* * * * *